(12) United States Patent
Romero

(10) Patent No.: US 11,307,017 B2
(45) Date of Patent: Apr. 19, 2022

(54) SINGLE CHANNEL MAGNETORESISTANCE-BASED ANGLE SENSOR

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 319 days.

(21) Appl. No.: 16/749,074

(22) Filed: Jan. 22, 2020

(65) Prior Publication Data

US 2021/0223023 A1 Jul. 22, 2021

(51) Int. Cl.
*G01B 7/30* (2006.01)
*H03F 3/45* (2006.01)
*G01R 1/00* (2006.01)

(52) U.S. Cl.
CPC . *G01B 7/30* (2013.01); *H03F 3/45* (2013.01)

(58) Field of Classification Search
CPC .......... G01R 1/00; G01R 33/02; G01R 33/09; G01R 35/00
See application file for complete search history.

(56) References Cited

U.S. PATENT DOCUMENTS

| 8,709,880 | B2 * | 4/2014 | Or-Bach | ............. | H01L 21/8221 257/E21.575 |
|---|---|---|---|---|---|
| 10,288,698 | B2 | 5/2019 | Romero | | |
| 10,585,147 | B2 | 3/2020 | Romero | | |

| 2007/0296411 | A1 * | 12/2007 | Thomas | ................. | G01D 3/021 324/251 |
|---|---|---|---|---|---|

(Continued)

FOREIGN PATENT DOCUMENTS

| DE | 10 2008 039 333 A1 | 2/2010 |
|---|---|---|
| EP | 3 653 998 A1 | 5/2020 |
| EP | 3855127 A1 | 7/2021 |

OTHER PUBLICATIONS

Extended European Search Report (EESR) dated Jun. 8, 2021 for European Application No. 20216712.8; 9 Pages.

(Continued)

*Primary Examiner* — Jermele M Hollington
*Assistant Examiner* — Temilade S Rhodes-Vivour
(74) *Attorney, Agent, or Firm* — Daly, Crowley, Mofford & Durkee, LLP

(57) ABSTRACT

In one aspect, an angle sensor includes analog circuitry configured to generate an analog value having a tangent value, an analog-to-digital converter configured to convert the analog value to a digital value and digital circuitry configured to receive the digital value. The analog circuitry includes a plurality of magnetoresistance elements that include a first magnetoresistance element configured to provide a cosine value indicative of a magnetic field along a first axis and a second magnetoresistance element configured to provide a sine value indicative of the magnetic field along a second axis orthogonal to the first axis. The tangent value is determined by the cosine and sine values. The digital circuitry includes an angle processor configured to use the digital value and a fixed value in an arctangent algorithm to generate an angle of a direction of the magnetic field.

20 Claims, 9 Drawing Sheets

(56) References Cited

U.S. PATENT DOCUMENTS

| | | |
|---|---|---|
| 2010/0156397 A1 | 6/2010 | Yabusaki et al. |
| 2012/0129301 A1* | 5/2012 | Or-Bach ............. H01L 27/1203 |
| | | 438/129 |
| 2015/0143311 A1* | 5/2015 | Chang .................... G06F 30/20 |
| | | 716/111 |
| 2017/0219665 A1* | 8/2017 | Alpago ................ G01D 5/2448 |
| 2019/0113592 A1 | 4/2019 | Rigoni et al. |
| 2019/0257671 A1* | 8/2019 | Osabe ..................... G01D 5/16 |

OTHER PUBLICATIONS

Response to European Communication dated Aug. 2, 2021 and to Extended European Search Report (EESR) dated Jun. 8, 2021 for European Application No. 20216712.8; Response filed Jan. 28, 2022; 20 Pages.

* cited by examiner

SINGLE CHANNEL MAGNETORESISTANCE-BASED ANGLE SENSOR

BACKGROUND

Typically, a magnetic-field angle sensor measures an angle of a direction of a magnetic-field vector through 360° in an x-y plane. In one example, a magnetic-field angle sensor may be used to detect an angular position of a rotating magnet. Some magnetic-field angle sensors may include a plurality of magnetic-field sensing elements. For example, one magnetic-field sensing element may measure a cosine signal in a first channel and another magnetic-field sensing element may measure a sine signal in a second channel. The sine and cosine signals in each channel are separately converted from analog to digital. The digital cosine and sine signals are inputted separately into an arctangent algorithm such as one provided by a CORDIC (COordinate Rotation DIgital Computer) to determine the angle of the direction of the magnetic-field vector.

SUMMARY

In one aspect, an angle sensor includes analog circuitry configured to generate an analog value having a tangent value, an analog-to-digital converter (ADC) configured to convert the analog value to a digital value and digital circuitry configured to receive the digital value. The analog circuitry includes a plurality of magnetoresistance elements that include a first magnetoresistance element configured to provide a cosine value indicative of a magnetic field along a first axis and a second magnetoresistance element configured to provide a sine value indicative of the magnetic field along a second axis orthogonal to the first axis. The tangent value is determined by the cosine value and the sine value. The digital circuitry includes an angle processor configured to use the digital value and a fixed value in an arctangent algorithm to generate an angle of a direction of the magnetic field.

In another aspect, an angle sensor includes a means for generating an analog value having a tangent value; a converter to convert the analog value to a digital value; and a means for using the digital value and a fixed value to generate an angle of a direction of the magnetic field.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to determine a tangent value in an analog domain for an angle sensor and provide the tangent value in a single channel to digital processing circuitry to determine an angle of a direction of a magnetic-field vector. The techniques described herein reduce integrated circuit (IC) area and power consumption on the IC compared to traditional two-channel solutions that determine a tangent value in a digital domain.

Figure 1:
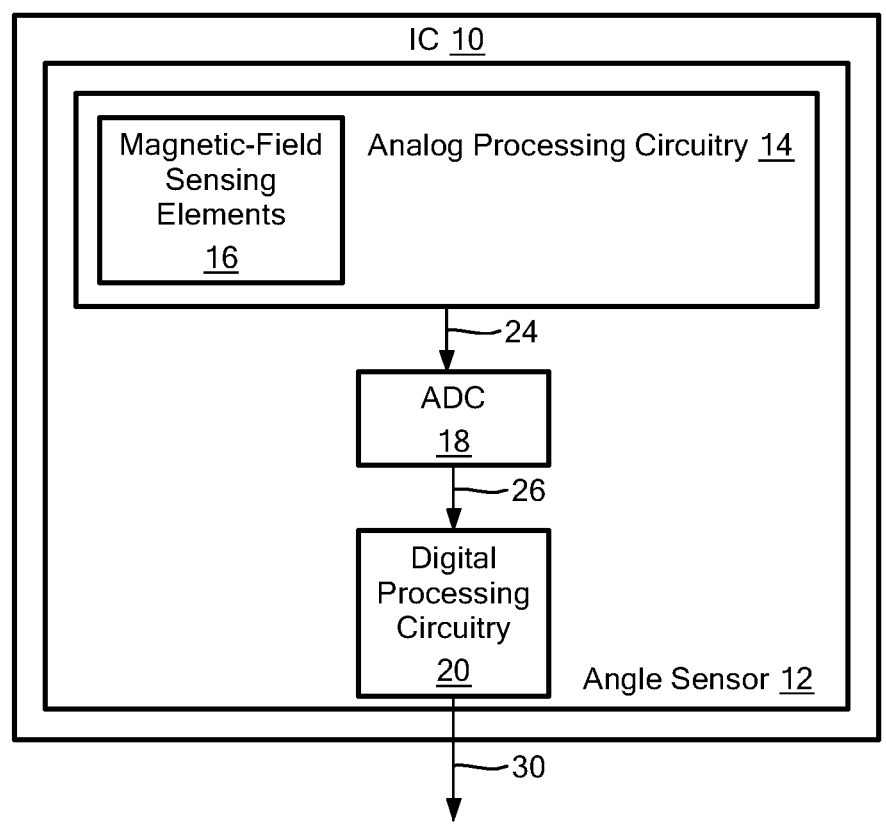
FIG. 1 is a block diagram of an example of an integrated circuit with a magnetic-field sensor.

Referring to FIG. 1, an integrated circuit (IC) 10 includes an angle sensor 12, which determines an angle of a direction of a magnetic-field vector. The angle sensor 12 includes analog processing circuitry 14, which includes magnetic-field sensing elements 16. The angle sensor 12 also includes an analog-to-digital converter (ADC) 18 and a digital processing circuitry 20. The magnetic-field sensing elements 16 provide signals representative of the strength of the detected magnetic field. The analog processing circuitry 14 processes the signals from the magnetic-field sensing elements to provide an analog signal 24. The signal 24 is provided by the analog processing circuitry 16 in a single channel, and the signal 24 includes a tangent value.

The analog-to-digital converter 18 receives and converts the analog signal 24 to a digital signal 26. The digital processing circuitry 20 processes the digital signal 26 to produce an output signal 30, which indicates the angle of the direction of the magnetic-field vector.

As used herein, the term "magnetic-field sensing element" is used to describe a variety of electronic elements that can sense a magnetic field. The magnetic-field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic-field sensing elements tend to have an axis of maximum sensitivity parallel to a substrate that supports the magnetic-field sensing element, and others of the above-described magnetic-field sensing elements tend to have an axis of maximum sensitivity perpendicular to a substrate that supports the magnetic-field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

The angle sensor 12 is a magnetic-field sensor. As used herein, the term "magnetic-field sensor" is used to describe a circuit that uses a magnetic-field sensing element, generally in combination with other circuits. Magnetic-field sensors are used in a variety of applications, including, but not limited to, the angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic-field sensor is used in combination with a back-biased or other magnet, and a magnetic-field sensor that senses a magnetic field density of a magnetic field.

Figure 2:
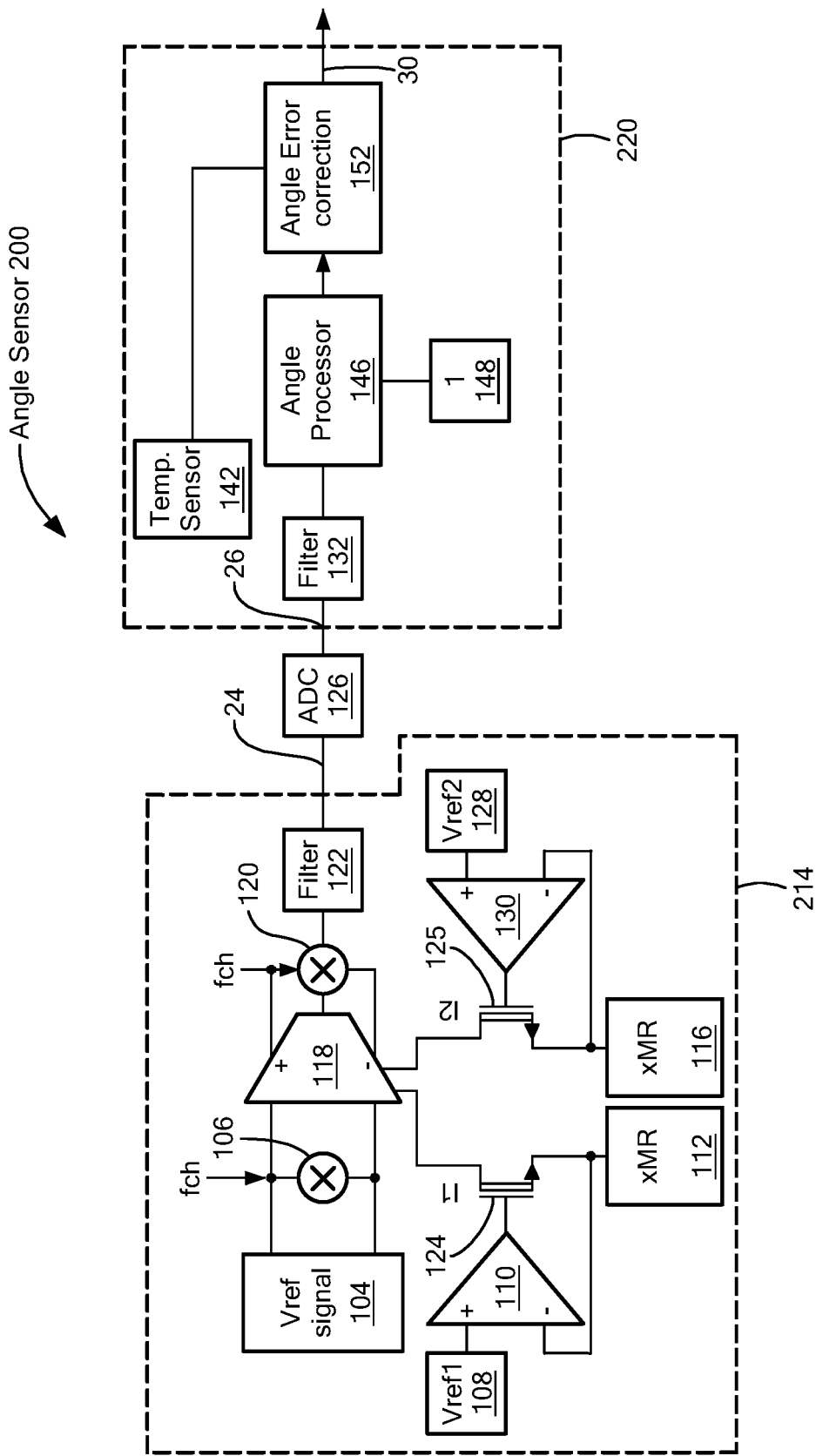
FIG. 2 is a block diagram of an example of an angle sensor in FIG. 1.

Referring to FIG. 2, one example of the angle sensor 12 (FIG. 1) is an angle sensor 200. The angle sensor 200 includes the ADC 126, analog circuitry 214 and digital circuitry 220.

The analog circuitry 214 is an example of the analog circuitry 14 (FIG. 1). The analog circuitry 214 includes an amplifier 118 (e.g., a variable gain amplifier) having an input connected to a mixer 106 and an output connected to a mixer 120. The mixer 106 receives a chopping frequency fch and is connected to a reference voltage 104. In one example, the reference voltage 104 is fixed. The mixer 120 receives the chopping frequency fch and is connected to a filter 122. The chopping frequency fch is used in conjunction with the mixers 106, 120 to remove offset components.

The amplifier 118 receives input currents I1, I2. I1 is provided by a drain of a transistor 124. The transistor 124 has a base connected to an output of an amplifier 110 and a source connected to a magnetoresistance element 112. The amplifier 110 has a first input connected to a reference voltage (Vref1) 108 and a second input connected to the magnetoresistance element 112.

I2 is provided by a drain of a transistor 125. The transistor 125 has a gate connected to an output of an amplifier 130 and a source connected to a magnetoresistance element 116. The amplifier 130 has a first input connected to a reference voltage (Vref2) 128 and a second input connected to the magnetoresistance element 116.

The magnetoresistance elements 112, 116 are examples of magnetic-field sensing elements 16 (FIG. 1). The magnetoresistance element 112 may be a GMR or a TMR. The magnetoresistance element 116 may be a GMR or a TMR.

The magnetoresistance element 112 is configured to provide a cosine value indicative of a magnetic field along a first axis. The magnetoresistance element 116 is configured to provide a sine value indicative of the magnetic field along a second axis orthogonal to the first axis.

In one example, the amplifier 118 is a Gilbert cell transconductance amplifier and the output of the amplifier 118 is proportional to I1/I2, where:

$$I1 = Vref1/R(\cos(\alpha)),$$

α is an angle of a direction of a magnetic-field vector.
Thus, the output current of the amplifier 118 is proportional to $K^*\tan(\alpha)$, where K is a constant.

The signal 24, which is in proportion to $K^*\tan(\alpha)$, is provided to the ADC 26 and converted to the digital signal 26 and received by the digital circuitry 220. The digital circuitry 220 includes a filter 132 which filters the signal 26 and provides the filtered signal to an angle processor 146. In one example, the filter 132 is a cascaded integrator-comb (CIC) filter. In one example, the angle processor 146 is a CORDIC (COordinate Rotation DIgital Computer).

The angle processor 146 may perform various trigonometric functions that can be used to compute an angle of magnetic field. In one example, the angle processor 146 performs a function, atan 2 (P1, P2) to determine a, the angle of the direction of the magnetic-field vector, where P1 and P2 are parameters. The angle processor 146 receives a fixed value 148 which is used for the parameter P2. For example, the fixed value 148 is a "1." The parameter P1 corresponds to and is proportional to $K^*\tan(\alpha)$. In one example, the angle processor 146 calculates atan 2(x/y, 1)=atan(x/y). After the angle processor 146 determines an angle α, the angle error correction circuit 152 corrects the angle a for any errors and provides the output signal 30 with the corrected angle α. In one example, the angle error correction circuit 152 is connected to a temperature sensor 142 and the angle error correction circuit 152 corrects for angle errors caused by temperature.

The output of the analog circuitry 214 includes a harmonic distortion, which should be accounted for in processing. For instance, the output voltage of the analog circuitry signal 214 is Vo (i.e., the signal 24) where:

$$Vo = \frac{Vref1}{Vref2} \cdot \frac{R_0\left(1 + \frac{\Delta R}{R_0} \cdot \sin(\alpha)\right)}{R_0\left(1 + \frac{\Delta R}{R_0} \cdot \cos(\alpha)\right)} = K\frac{\frac{\Delta R}{R_0} \cdot \sin(\alpha)}{1 + \frac{\Delta R}{R_0} \cdot \cos(\alpha)} + K\frac{1}{1 + \frac{\Delta R}{R_0} \cdot \cos(\alpha)},$$

$$Vo = K \cdot \tan\frac{\alpha}{2} + \frac{K}{1 + \frac{\Delta R}{R_0} \cdot \cos(\alpha)},$$

where $R_0$ is the value of the magnetoresistance element without magnetic field applied, $\Delta R$ is the resistance difference of the magnetoresistance element with respect to $R_0$ when a magnetic field is applied. The harmonic distortion is in the second term or $$\frac{K}{1 + \frac{\Delta R}{R_0} \cdot \cos(\alpha)}.$$

Figure 3:
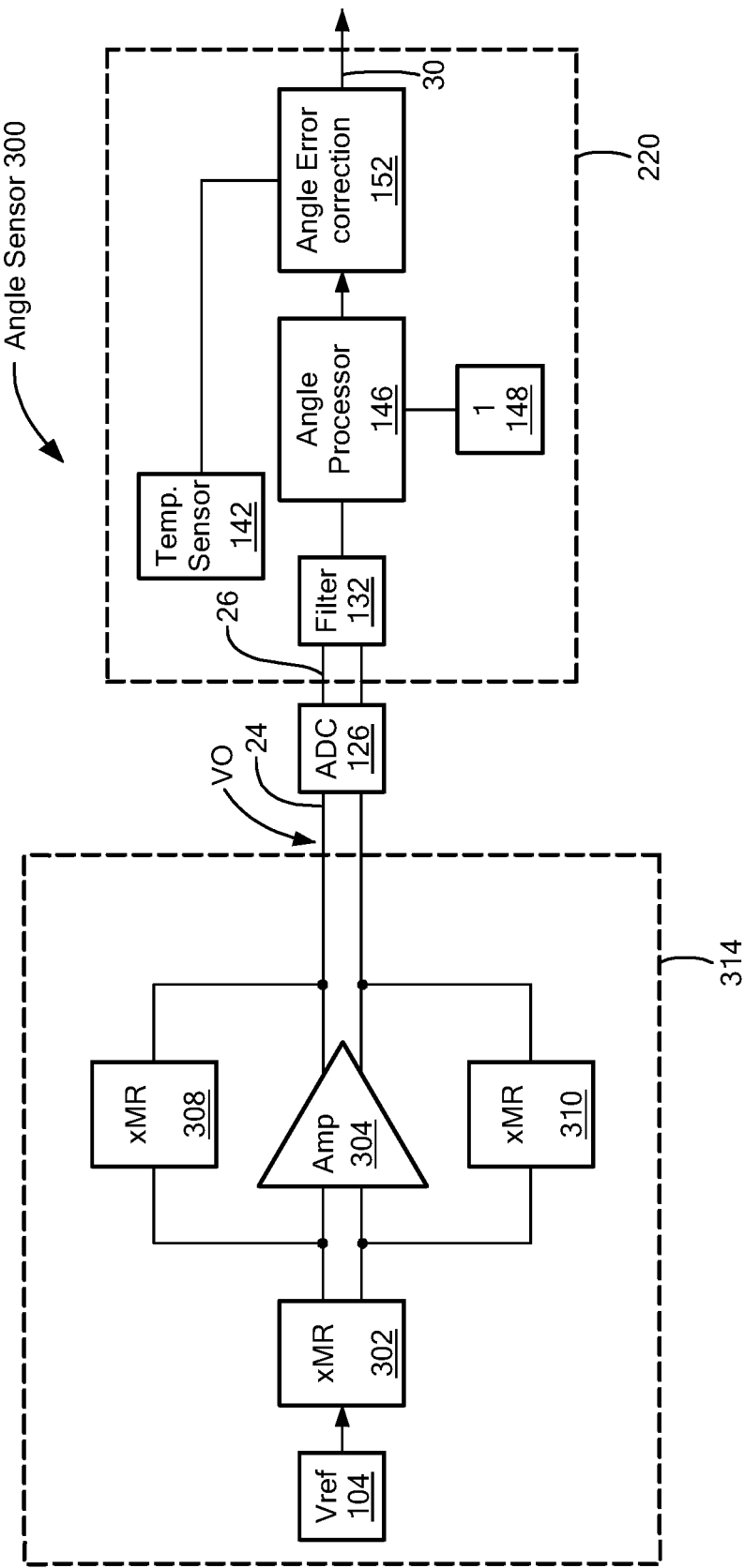
FIG. 3 is a block diagram of an example of the angle sensor in FIG. 1.

Referring to FIG. 3, an example of the angle sensor 100 (FIG. 1) is an angle sensor 300. The angle sensor 300 includes the ADC 126, the digital circuitry 220 and analog circuitry 314.

The analog circuitry 314 includes an amplifier 304. A first input of the amplifier 304 is connected to a magnetoresistance element 302 and to a magnetoresistance element 308. A second input of the amplifier 304 is connected to the magnetoresistance element 302 and to a magnetoresistance element 310. The magnetoresistance element 302 is connected to the reference voltage (Vref) 104.

The magnetoresistance element 308 is connected to the first output of the amplifier 304 and the magnetoresistance element 310 is connected to the second output of the amplifier 304. In one example, the amplifier 304 is a differential amplifier.

The magnetoresistance elements 302, 308, 310 are examples of magnetic-field sensing elements 16 (FIG. 1).

The magnetoresistance element 302 may be a GMR or a TMR. The magnetoresistance element 308 may be a GMR or a TMR. The magnetoresistance element 310 may be a GMR or a TMR.

The magnetoresistance element 302 is configured to provide a cosine value indicative of a magnetic field along a first axis. The magnetoresistance elements 308, 310 are configured to provide a sine value indicative of the magnetic field along a second axis orthogonal to the first axis. In one example, the magnetoresistance element 308 is the same as magnetoresistance elements 310.

The output of the amplifier 304 is the signal 24, which is proportion to K*tan(α) and is provided to the ADC 26 and converted to the digital signal 26 and received by the digital circuitry 220 to produce the signal output 30 with the angle α as previously described herein.

Like the analog circuitry 214, the analog circuitry 314 includes a harmonic distortion, which should be accounted for in processing. For instance, $$Vo = Vref \cdot \frac{R_0\left(1 + \frac{\Delta R}{R_0} \cdot \sin(\alpha)\right)}{R_0\left(1 + \frac{\Delta R}{R_0} \cdot \cos(\alpha)\right)} = Vref \cdot \frac{1 + \frac{\Delta R}{R_0} \cdot \sin(\alpha)}{1 + \frac{\Delta R}{R_0} \cdot \cos(\alpha)} + \frac{1}{1 + \frac{\Delta R}{R_0} \cdot \cos(\alpha)}.$$

The harmonic distortion is in the second term or $$\frac{1}{1 + \frac{\Delta R}{R_0} \cdot \cos(\alpha)}.$$

Figure 4:
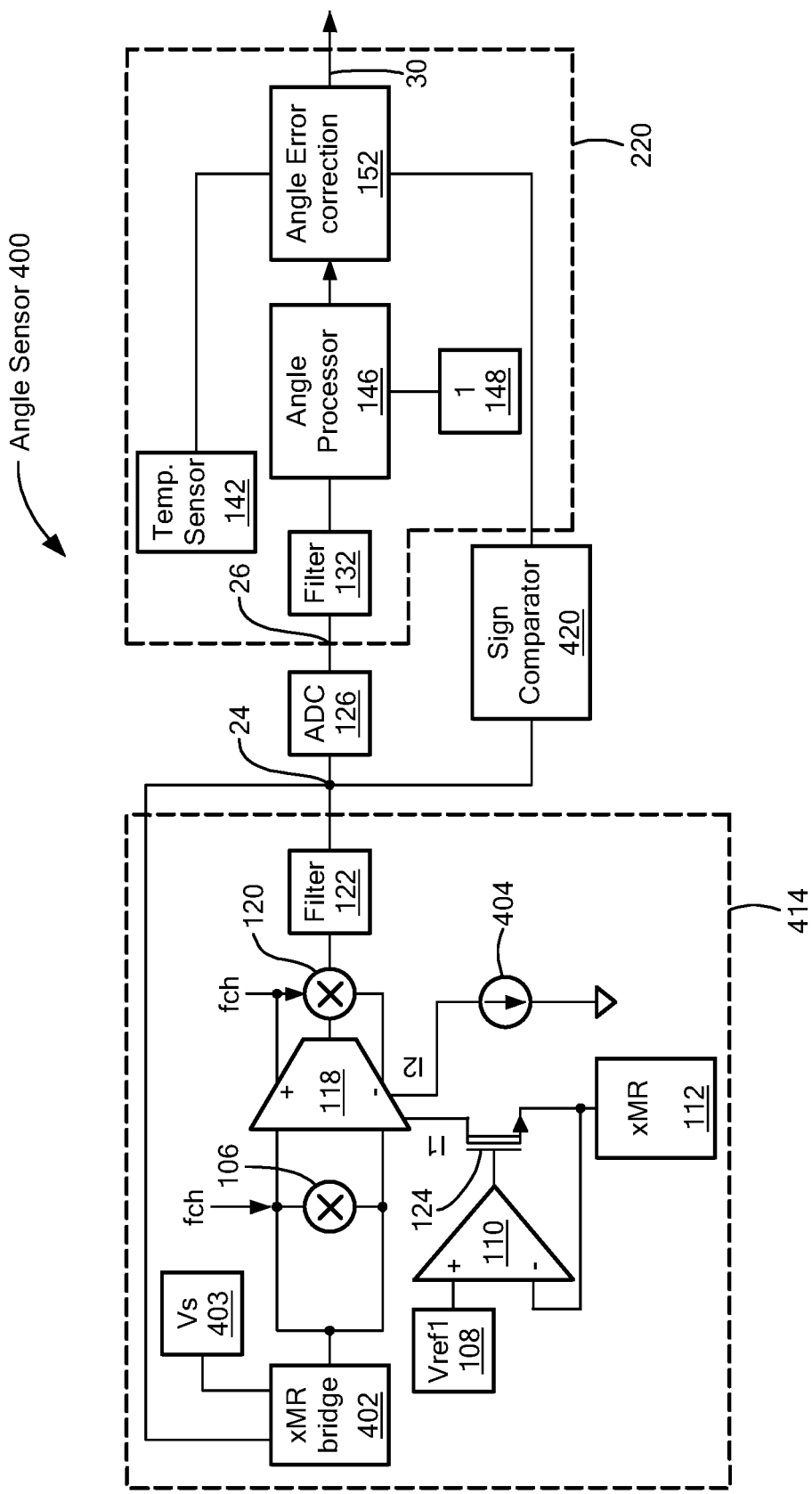
FIG. 4 is a block diagram of another example of the angle sensor in FIG. 2.

Referring to FIG. 4, another example of an angle sensor 200 (FIG. 2) is an angle sensor 400. The angle sensor 400 includes the ADC 126, the digital circuitry 220, a sign comparator 420 and analog circuitry 414.

The analog circuitry 414 is similar to the analog circuitry 214 except the transistor 125, the amplifier 130 and the magnetoresistance element 116 are replaced by a current source 404, and the reference signal (Vref) 104 is replaced by a bridge of magnetoresistance elements 402, which receives a supply voltage Vs 403. In this configuration, the current source provides 12.

The bridge of magnetoresistance elements 402 is an example of magnetic-field sensing elements 16 (FIG. 1). The bridge of magnetoresistance elements 402 may include a GMR or a TMR or both. In one example, the bridge of magnetoresistance elements 402 is configured to provide a differential output that is proportional to a sine value indicative of the magnetic field along the second axis orthogonal to the first axis.

Unlike the analog circuitry 214, 314, the analog circuitry 414 does not provide an output voltage Vo (i.e., the signal 24) that includes a harmonic distortion term. That is, $$Vo = \frac{Vs \cdot \frac{\Delta R}{R_0} \cdot \sin(\alpha)}{I2 \cdot R_0 \cdot \left(1 + \frac{\Delta R}{R_0} \cdot \cos(\alpha)\right)} = K \cdot \frac{\frac{\Delta R}{R_0} \cdot \sin(\alpha)}{1 + \frac{\Delta R}{R_0} \cdot \cos(\alpha)} \propto \tan\left(\frac{\alpha}{2}\right).$$

In this configuration, the sine bridge 402 effectively prevents the formation of a harmonic term in the output signal 24 of the analog circuitry 414. Since Vo is related to tan (α/2), the angle sensor 400 detects an angle between 0 and 180°.

Figure 4A:
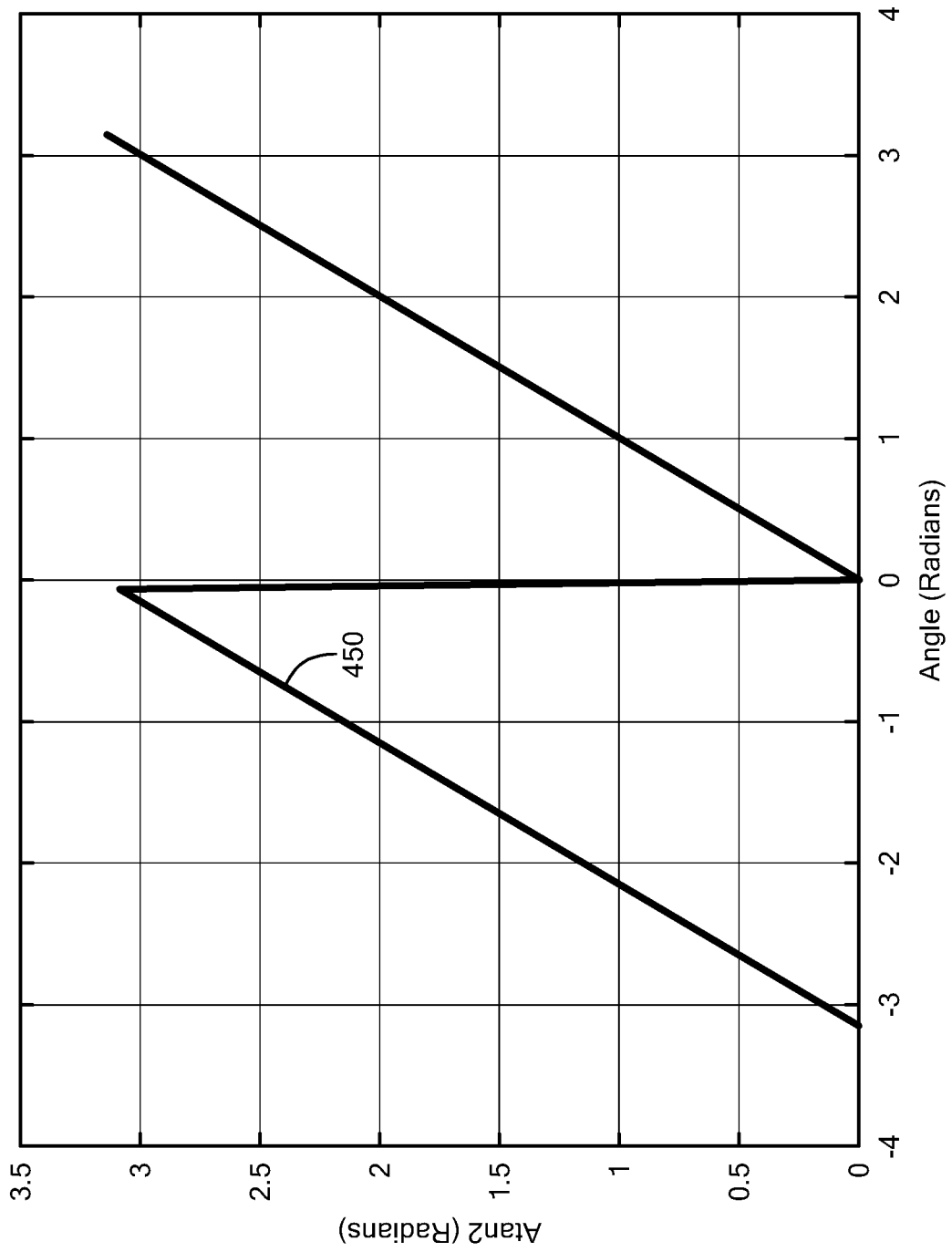
FIG. 4A is a graph of an output of an angle processor.

The sign comparator 420 is connected to the bridge 402 and to the angle error correction circuit 152. In one example, the angle processor 146 solves for atan 2 (1, x/y). As shown in FIG. 4A, a curve 450 representing the atan 2 value versus the angle indicates that the angle may be between −π and zero or between zero and π. That is, the sign of the angle is indefinite. The angle error correction circuit 120 uses the sign determined by the sign comparator 420 to account for the correct sign and provide the correct angle α in the output 30.

Figure 5:
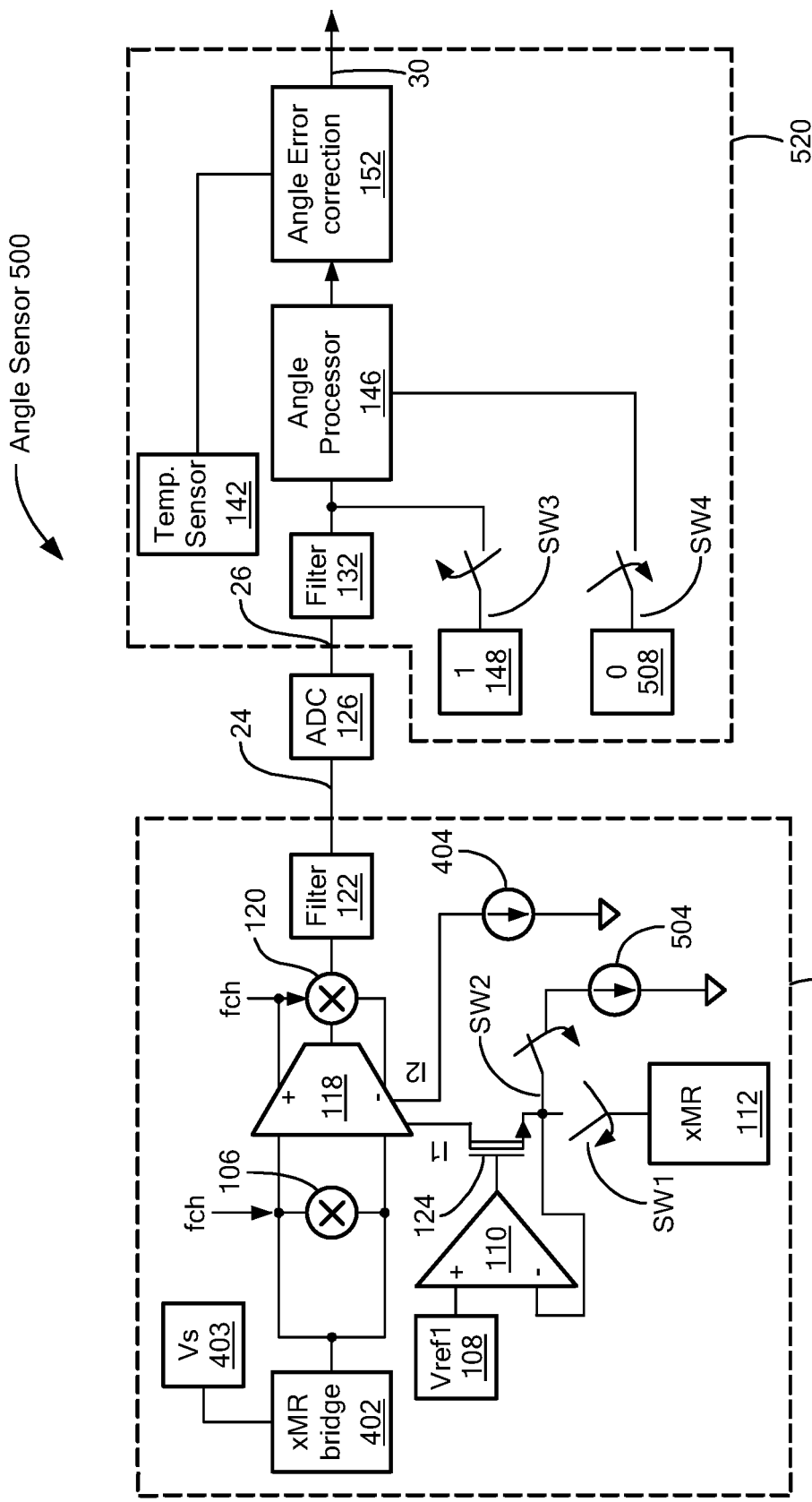
FIG. 5 is a block diagram of an example of the angle sensor in FIG. 4.

In one example, the sign comparator 420 performs as a comparator monitoring the output of the bridge 402 where the output of the bridge 420 is proportional to sine (angle). The sign comparator 420 determines when the sine is above or below zero (which occurs once in a full period before completing a full turn and is an indication of the change of sign of the angle that can be used to determine the angle sign). Referring to FIG. 5, an example of an angle sensor 400 (FIG. 4) is an angle sensor 500. The angle sensor 500 includes the ADC 126, analog circuitry 514 and digital circuitry 520.

The analog circuitry 514 is similar to the analog circuitry 414 (FIG. 4) except the source of the transistor 124 is connected to a first switch SW1, which is connected to the magnetoresistance element 112; and the source of the transistor 124 is connected to a second switch SW2, which is connected to a current source 504.

The digital circuitry 520 is similar to the digital circuitry 220 (FIG. 2) except the digital circuitry 520 includes a third switch SW3, which is connected to the angle processor 146 and a fourth switch SW4, which is connected to the angle processor 146. The third switch SW3 is connected to the fixed value 148 and the fourth switch SW4 is connected to a fixed value 508.

In a first mode, the switches SW1 and SW3 are closed and the switches SW2 and SW4 are open. In the first mode, the source of the transistor 124 is connected to the magnetoresistance element 112 and the fixed value 148 is connected to the angle processor 146. In the first mode, the output voltage Vo is the same as in angle sensor 400. That is, $$Vo = \frac{Vs \cdot \frac{\Delta R}{R_0} \cdot \sin(\alpha)}{I2 \cdot R_0 \cdot \left(1 + \frac{\Delta R}{R_0} \cdot \cos(\alpha)\right)} = K \cdot \frac{\frac{\Delta R}{R_0} \cdot \sin(\alpha)}{1 + \frac{\Delta R}{R_0} \cdot \cos(\alpha)} \propto \tan\left(\frac{\alpha}{2}\right).$$

In a second mode, the switches SW1 and SW3 are open and the switches SW2 and SW4 are closed. In the second mode, the source of the transistor 124 is connected to the current source 504 and the fixed value 508 is connected to the angle processor 146. The fixed value 508 has a value of '0.' In the first mode, the output voltage Vo becomes:

$$Vo = K' R_o \sin(\alpha).$$

Figure 5A:
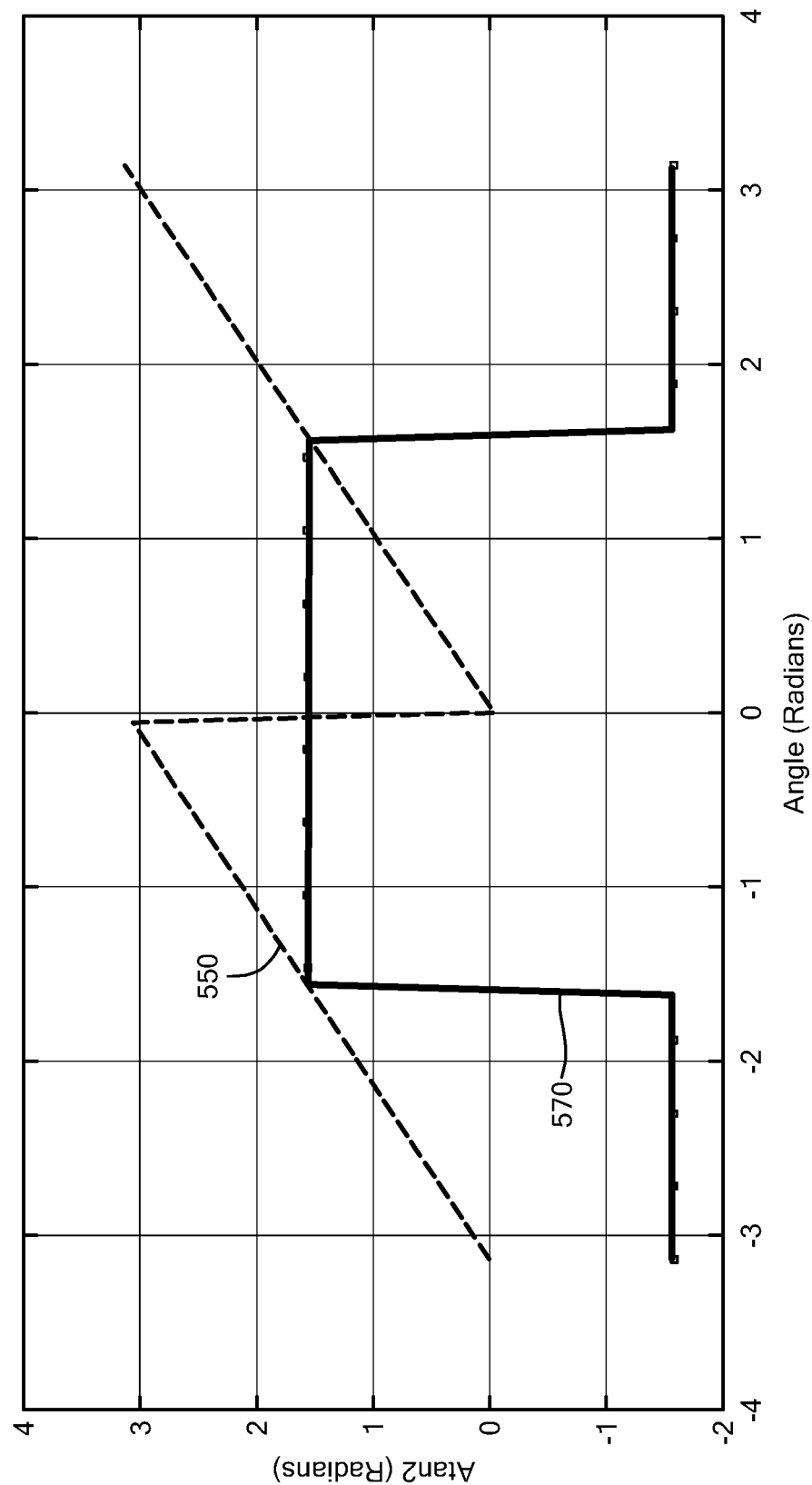
FIG. 5A is a graph of outputs of the angle processor for two modes.

By using the results from both the first mode and the second mode, the angle sensor 500 can detect from zero to 360°. For example, FIG. 5A includes a curve 550 determined in the first mode representing atan 2 (1, x/y) and a curve 570 determined in the second mode representing atan 2 (x, 1). By combining both the first and second modes, an angle may be determined anywhere between −π to +π For example, atan 2 values for the first mode between zero and π/2 equates to: (1) an angle between −π to −π/2 if the second mode has an atan 2 value equal to −π/2 or (2) an angle between zero to π/2 if the second mode has an atan 2 value equal to +π/2. In another example, atan 2 values for the first mode between +π/2 and +π equates to: (1) an angle between −π/2 to zero if the second mode has an atan 2 value equal to +π/2 or (2) an angle between +π/2 to +π if the second mode has an atan 2 value equal to −π/2.

After the angle processor determines the angle α, the angle error correction circuit 152 corrects the angle α for any errors and provides the output signal 30 with the corrected angle α.

Figure 6:
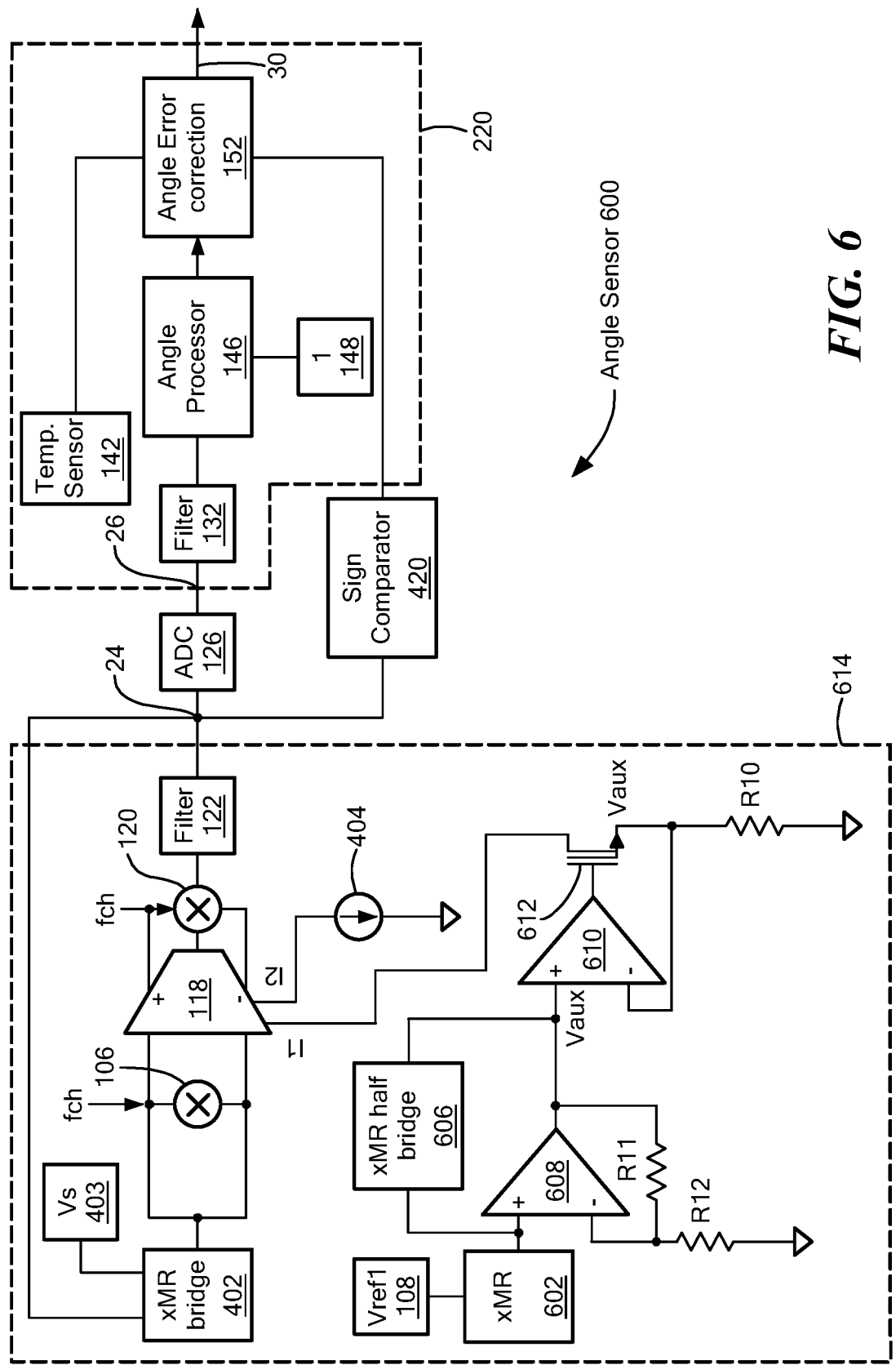
FIG. 6 is a block diagram of another example of the angle sensor in FIG. 4.

Referring to FIG. 6, another example of the angle sensor 400 (FIG. 4) is an angle sensor 600. The angle sensor 600 includes the ADC 126, the digital circuitry 220, the sign comparator 420 and analog circuitry 614.

The analog circuitry 614 is similar to the analog circuitry 414 except the magnetoresistance element 112, the transistor 124 and the amplifier 110 are replaced with a magnetoresistance element 602, a half-bridge of magnetoresistance elements 606, an amplifier 608, an amplifier 610 and a transistor 612.

A drain of the transistor 612 is connected to the amplifier 118, a base of the transistor 612 is connected to an output of the amplifier 610 and a drain of the transistor 612 is connected to a first input of the amplifier 610 and connected to a resistor R10, which is connected to ground.

A second input of the amplifier 610 is connected to the half-bridge 606, an output of the amplifier 608 and a resistor R11. A first input of the amplifier 608 is connected to the half-bridge 606 and the magnetoresistance element 602 and a second input of the amplifier 608 is connected to the resistor R11 and to a resistor R12, which is connected to the ground. The magnetoresistance element 602 is connected to the reference voltage (Vref1) 108.

The magnetoresistance elements of the half-bridge 606 and the magnetoresistance element 602 are examples of magnetic-field sensing elements 16 (FIG. 1). The magnetoresistance element 602 may be a GMR or a TMR. The magnetoresistance element 602 is configured to provide a cosine value indicative of the magnetic field along the first axis.

The half-bridge 606 may include a GMR or a TMR or both. In one example, the half-bridge of magnetoresistance elements 402 is configured to provide a differential output that is proportional to a cosine value indicative of the magnetic field along the first axis orthogonal.

The voltage in the second input of the amplifier 610 and the voltage at the source of the transistor is the same and equal to the voltage Vaux. In one example, the amplifier 608 is a negative impedance converter. In one example, the resistors R10, R11, R12 have the same resistance value R.

$$Vaux = Vref1 \cdot \frac{2R_2}{R_2 - R_1} = Vref1 \cdot \frac{2R_o}{\Delta R \cdot \cos(\alpha)}$$

$$I1 = \frac{Vaux}{R} = Vref1 \cdot \frac{2R_0}{R \cdot \Delta R \cdot \cos(\alpha)}$$

$$Vo = \frac{Vref1 \cdot Vs \cdot 2\Delta R \cdot \sin(\alpha)}{I2 \cdot R \cdot \Delta R \cdot \cos(\alpha)} = K \cdot \frac{\sin(\alpha)}{\cos(\alpha)} = K \cdot \tan(\alpha),$$

where $R_1$ is the resistance across the magnetoresistance element 602 and R2 is the resistance across the half-bridge 606. Thus, the output 24 of the analog circuitry 614 is proportional to the tangent of the angle. The remaining circuitry shown in FIG. 6 produces the output signal 30 with the angle α as previously described, for example, in FIG. 4.

Figure 7:
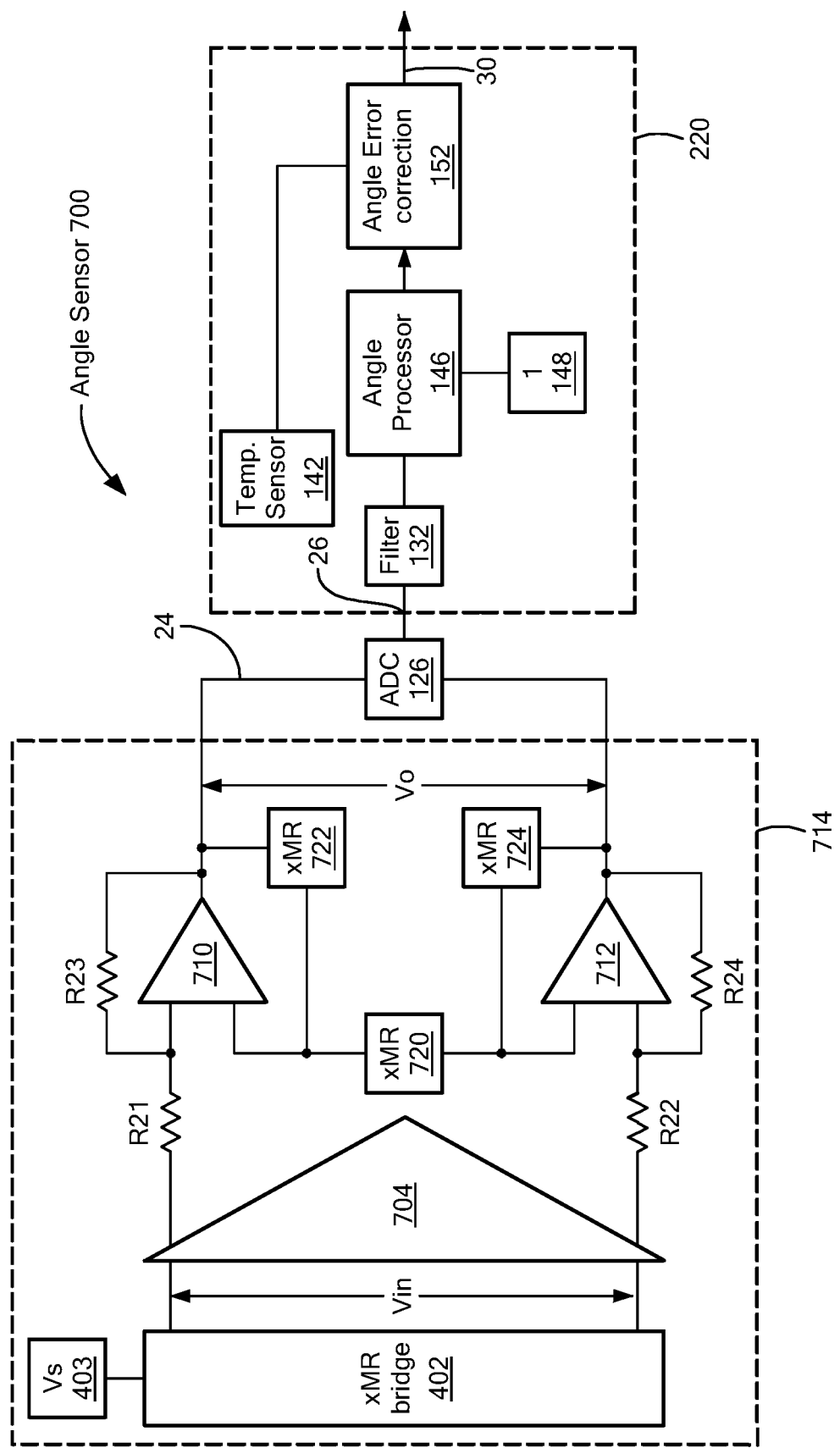
FIG. 7 is a block diagram of a further example of the angle sensor in FIG. 1.

Referring to FIG. 7, a further example of the angle sensor 100 (FIG. 1) is an angle sensor 700. The angle sensor 700 includes the ADC 126, the digital circuitry 220 and analog circuitry 714.

The analog circuitry 714 includes an amplifier 704, an amplifier 710, an amplifier 712. A first and second input of the amplifier 704 is connected to the bridge of magnetoresistance elements 402 which provides a voltage signal Vin. The bridge 402 is connected to a supply voltage Vs 702. The first output of the amplifier 704 is connected to a resistor R21 and the second input of the amplifier 704 is connected to a resistor R22.

The amplifier 710 has a first input connected to the resistor R21 and to a resistor R23, and a second input connected to a magnetoresistance element 720 and a magnetoresistance element 722. The resistor R23 and the magnetoresistance element 722 are connected to an output of the amplifier 710.

The amplifier 712 has a first input connected to the resistor R22 and to a resistor R24, and a second input connected to the magnetoresistance element 720 and a magnetoresistance element 724. The resistor R24 and the magnetoresistance element 724 are connected to an output of the amplifier 712. The outputs of the amplifiers 710, 712 are connected to the ADC 126 and produce the signal Vo.

The magnetoresistance elements 720, 722, 724 are examples of magnetic-field sensing elements 16 (FIG. 1). The magnetoresistance element 720 may be a GMR or a TMR. The magnetoresistance element 722 may be a GMR or a TMR. The magnetoresistance element 724 may be a GMR or a TMR. The magnetoresistance elements 720 is configured to provide a cosine value indicative of the magnetic field along the first axis. The magnetoresistance elements 722, 724 are configured to provide a negative cosine indicative of the magnetic field along the first axis, thus the magnetoresistance elements 722, 724 produce an inverted output of what magnetoresistance element 720 produces over angle.

In one example, the resistors R21, R22, R23, R24 have the same resistance value R.

$$Vo = Vin \cdot \frac{R_3 + R_4}{R_3 - R_4},$$

where, $$R_3 = R_0 + \Delta R \cdot \cos(\alpha)$$

$$R_4 = R_0 - \Delta R \cdot \cos(\alpha)$$

$$Vin = Vs \cdot \frac{\Delta R}{R_0} \cdot \sin(\alpha)$$

$$Vo = Vs \cdot \sin(\alpha) \cdot \frac{2R_0}{2\Delta R \cdot \cos(\alpha)} = Vs \cdot \tan(\alpha),$$

where $R_3$ is the resistance across the magnetoresistance element 720 and $R_4$ is the resistance across each of the magnetoresistance elements 722, 724. Thus, the output 24 of the analog circuitry 714 is proportional to the tangent of the angle α. The remaining circuitry shown in FIG. 7 produces the output signal 30 with the angle α as previously described.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An angle sensor comprising:
    analog circuitry configured to generate an analog value having a tangent value, the analog circuitry comprising a plurality of magnetoresistance elements comprising:
        a first magnetoresistance element configured to provide a cosine value indictive of a magnetic field along a first axis; and
        a second magnetoresistance element configured to provide a sine value indicative of the magnetic field along a second axis orthogonal to the first axis, wherein the tangent value is determined by the cosine value and the sine value;
    an analog-to-digital converter (ADC) configured to convert the analog value to a digital value; and
    digital circuitry configured to receive the digital value, the digital circuitry comprising an angle processor configured to use the digital value and a fixed value in an arctangent algorithm to generate an angle of a direction of the magnetic field,
    wherein the analog circuitry comprises:
    a variable gain amplifier configured to receive a first current inversely proportional to the cosine value;
    a transistor having a drain configured to provide the first current and a gate connected to an output of an amplifier; and
    the variable gain amplifier having a first input configured to receive a reference voltage.

2. The angle sensor of claim 1, wherein the variable gain amplifier having a second input connected to the first magnetoresistance element, and wherein the transistor having a source connected to the first magnetoresistance element.

3. The angle sensor of claim 1, wherein the variable gain amplifier having a second input connected to a source of the transistor, and
    wherein in a first mode the source of the transistor is connected to the first magnetoresistance element and in a second mode, the source of the source of the transistor is connected to a fixed current.

4. The angle sensor of claim 1, wherein in the first mode the fixed value is 1 and in the second mode the fixed value is zero.

5. The angle sensor of claim 1, wherein the variable gain amplifier is further configured to receive a second current inversely proportional to the sine value.

6. The angle sensor of claim 1, wherein the transistor is a first transistor, the amplifier is a first amplifier and the reference voltage is a first reference voltage,
    wherein the analog circuitry further comprises:
        a second transistor having a drain configured to provide the second current, a source connected to the second magnetoresistance element and a gate connected to an output of a second amplifier; and
        the amplifier having a first input configured to receive a second reference voltage.

7. The angle sensor of claim 1, wherein the amplifier is further configured to receive a second current from a fixed current source.

8. The angle sensor of claim 7, wherein the analog circuitry further comprises a bridge comprising the second magnetoresistance element, wherein a differential output of the bridge is proportional to a sine indicative of the magnetic field along the second axis, wherein the bridge provides an input voltage to the variable gain amplifier.

9. The angle sensor of claim 1, wherein the analog circuitry further comprises:
    a Gilbert cell configured to receive a first current inversely proportional to the cosine value and to receive a second current from a fixed current source;
    a transistor having a drain configured to provide the first current and a gate connected to an output of a first amplifier; and
    the first amplifier having a first input connected to a source of the transistor and to a first resistor connected to a ground and having a second input connected to:
        an output of a second amplifier;
        a second resistor connected to a third resistor; and
        a half-bridge whose two magnetoresistance elements are proportional to +cos and −cos of the magnetic field angle.

10. The angle sensor of claim 9, wherein a first input of the second amplifier is connected to the half-bridge whose two magnetoresistance MR elements are proportional to +cos and −cos of the magnetic field angle and to the first magnetoresistance (proportional to cos of the magnetic field angle element and a second input of the second amplifier connected to the second resistor and a third resistor, the third resistor being connected to ground.

11. The angle sensor of claim 1, wherein in the fixed value is 1.

12. The angle sensor of claim 1, wherein the first magnetoresistance element is a giant magnetoresistance element or a tunnel magnetoresistance element.

13. The angle sensor of claim 12, wherein the second magnetoresistance element is a giant magnetoresistance element or a tunnel magnetoresistance element.

14. The angle sensor of claim 1, wherein the angle processor is a CORDIC (Coordinate Rotation Digital Computer).

15. An angle sensor comprising:
    analog circuitry configured to generate an analog value having a tangent value, the analog circuitry comprising a plurality of magnetoresistance elements comprising:
        a first magnetoresistance element configured to provide a cosine value indictive of a magnetic field along a first axis; and
        a second magnetoresistance element configured to provide a sine value indicative of the magnetic field along a second axis orthogonal to the first axis, wherein the tangent value is determined by the cosine value and the sine value;
    an analog-to-digital converter (ADC) configured to convert the analog value to a digital value; and
    digital circuitry configured to receive the digital value, the digital circuitry comprising an angle processor configured to use the digital value and a fixed value in an arctangent algorithm to generate an angle of a direction of the magnetic field; and
    a third magnetoresistance element configured to provide the sine value indicative of the magnetic field along the second axis,
    wherein the analog circuitry comprises an amplifier having a first input connected to the first magnetoresistance element and the second magnetoresistance element, a second input connected to the first magnetoresistance element and the second magnetoresistance element and a first output connected to the second magnetoresistance element and the ADC and a second output connected to the third magnetoresistance element and the ADC.

16. The angle sensor of claim 15, wherein the first magnetoresistance element and/or the second magnetoresistance element is a giant magnetoresistance element or a tunnel magnetoresistance element.

17. The angle sensor of claim 16, wherein the third magnetoresistance element is a giant magnetoresistance element or a tunnel magnetoresistance element.

18. An angle sensor comprising:
analog circuitry configured to generate an analog value having a tangent value, the analog circuitry comprising a plurality of magnetoresistance elements comprising:
　a first magnetoresistance element configured to provide a cosine value indictive of a magnetic field along a first axis; and
　a second magnetoresistance element configured to provide a sine value indicative of the magnetic field along a second axis orthogonal to the first axis, wherein the tangent value is determined by the cosine value and the sine value;
an analog-to-digital converter (ADC) configured to convert the analog value to a digital value; and
digital circuitry configured to receive the digital value, the digital circuitry comprising an angle processor configured to use the digital value and a fixed value in an arctangent algorithm to generate an angle of a direction of the magnetic field;
a bridge comprising the second magnetoresistance element;
　a third magnetoresistance element configured to provide the cosine value indicative of the magnetic field along the first axis; and
　a fourth magnetoresistance element configured to provide the cosine value indicative of the magnetic field along the first axis;
wherein the analog circuitry comprises:
　a buffer connected to an output of the bridge;
　a first amplifier having a first input, a second input connected to the first magnetoresistance element and an output connected to the third magnetoresistance element and the ADC;
　a first resistor connected to the buffer and the first input of the first amplifier;
　a second resistor connected to the first input of the amplifier and the output of the first amplifier;
　a second amplifier having a first input, a second input connected to the first magnetoresistance element and an output connected to the fourth magnetoresistance element and the ADC;
　a third resistor connected to the buffer and the first input of the second amplifier; and
　a fourth resistor connected to the first input of the second amplifier and the output of the second amplifier.

19. The angle sensor of claim 18, wherein the first magnetoresistance element and/or the second magnetoresistance element is a giant magnetoresistance element or a tunnel magnetoresistance element.

20. The angle sensor of claim 19, wherein the third magnetoresistance element and/or the fourth magnetoresistance element is a giant magnetoresistance element or a tunnel magnetoresistance element.

* * * * *

UNITED STATES PATENT AND TRADEMARK OFFICE
CERTIFICATE OF CORRECTION

PATENT NO. : 11,307,017 B2
APPLICATION NO. : 16/749074
DATED : April 19, 2022
INVENTOR(S) : Hernán D. Romero It is certified that error appears in the above-identified patent and that said Letters Patent is hereby corrected as shown below:

In the Specification

Column 3, Line 65 delete "ADC 26" and replace with --ADC 126--.

Column 5, Line 13 delete "ADC 26" and replace with --ADC 126--.

Column 6, Line 9 delete "circuit 120" and replace with --circuit 152--.

Column 6, Line 15 delete "bridge 420" and replace with --bridge 402--.

Column 7, Equation delete "vref1.vs.2ΔR" and replace with --vref1.vs.2.ΔR--.

Column 8, Lines 1-2 delete "sensor 100" and replace with --sensor 12--.

Column 8, Line 9 delete "Vs 702." and replace with --Vs 403.--.

Column 9, Line 10 delete "indictive" and replace with --indicative--.

Column 9, Line 42 delete ", the source of the source of the" and replace with --the source of the--.

Column 10, Line 45 delete "indictive" and replace with --indicative--.

In the Claims

Column 11, Line 16 delete "indictive" and replace with --indicative--.

Signed and Sealed this
Sixteenth Day of April, 2024

Katherine Kelly Vidal
*Director of the United States Patent and Trademark Office*